(12) United States Patent
Park

(10) Patent No.: US 9,490,013 B1
(45) Date of Patent: Nov. 8, 2016

(54) SEMICONDUCTOR MEMORY DEVICE AND METHOD OF OPERATING THE SAME

(71) Applicant: SK hynix Inc., Gyeonggi-do (KR)

(72) Inventor: Won Sun Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/073,345

(22) Filed: Mar. 17, 2016

(30) Foreign Application Priority Data

Oct. 13, 2015 (KR) .......................... 10-2015-0142879

(51) Int. Cl.
G11C 15/00 (2006.01)
G11C 15/04 (2006.01)
G11C 29/04 (2006.01)

(52) U.S. Cl.
CPC ............. *G11C 15/046* (2013.01); *G11C 29/04* (2013.01)

(58) Field of Classification Search
CPC ........................................................ G11C 15/00
USPC ............................................... 365/45–49.18
See application file for complete search history.

(56) References Cited

U.S. PATENT DOCUMENTS

| 5,377,147 | A * | 12/1994 | Merchant | ........... | G11C 16/3445 |
| | | | | | 365/185.09 |
| 6,229,742 | B1 * | 5/2001 | Srinivasan | ............. | G11C 15/00 |
| | | | | | 365/200 |
| 6,249,467 | B1 * | 6/2001 | Pereira | ................... | G11C 15/00 |
| | | | | | 365/200 |
| 6,275,426 | B1 * | 8/2001 | Srinivasan | ............. | G11C 15/00 |
| | | | | | 365/200 |
| 6,445,628 | B1 * | 9/2002 | Pereira | ................... | G11C 15/00 |
| | | | | | 365/200 |
| 6,614,685 | B2 * | 9/2003 | Wong | ...................... | G11C 5/025 |
| | | | | | 365/185.09 |
| 6,665,220 | B2 * | 12/2003 | Vlasenko | ............. | G11C 29/848 |
| | | | | | 365/189.07 |
| 7,092,289 | B1 * | 8/2006 | Wong | ...................... | G11C 5/025 |
| | | | | | 365/185.09 |
| 7,215,140 | B1 | 5/2007 | Saini et al. | | |
| 2003/0035322 | A1 * | 2/2003 | Wong | ...................... | G11C 5/025 |
| | | | | | 365/185.33 |
| 2003/0081464 | A1 * | 5/2003 | Vlasenko | ............... | G11C 15/00 |
| | | | | | 365/200 |
| 2010/0157641 | A1 * | 6/2010 | Shalvi | .................. | G11C 16/349 |
| | | | | | 365/45 |

FOREIGN PATENT DOCUMENTS

KR 1020140142035 12/2014
KR 1020140146916 12/2014

* cited by examiner

*Primary Examiner* — Harry W Byrne
(74) *Attorney, Agent, or Firm* — IP & T Group LLP

(57) ABSTRACT

The semiconductor memory device includes a memory cell array including guarantee blocks, normal blocks, and redundancy blocks. A bad block address indicates which block from the guarantee blocks and the normal blocks is defective, and an indication information indicates whether the bad block address belongs to the guarantee blocks or to the normal blocks. A request block address is supplied together with associated block type information. The block type information indicates whether the request block address belongs to the guarantee blocks or to the normal blocks. A match signal is enabled when the block type information matches the indication information, and the request block address matches the bad block address. The enablement of the match signal allows the defective block to be replaced with one block from the redundancy blocks.

20 Claims, 9 Drawing Sheets

SEMICONDUCTOR MEMORY DEVICE AND METHOD OF OPERATING THE SAME

CROSS-REFERENCE TO RELATED APPLICATION

The present application claims a priority to a Korean patent application number 10-2015-0142879 flied on Oct. 13, 2015, the entire disclosure of which is incorporated herein in its entirety by reference.

BACKGROUND

1. Technical Field

The present disclosure generally relates to a semiconductor memory device, and a method of operating the same.

2. Discussion of Related Arts

Semiconductor memory devices may be implemented using a semiconductor such as a silicon (Si), a Germanium (Ge), a gallium arsenide (GaAs), an indium phosphide (IP) or the like. Semiconductor memory devices may be classified into volatile and nonvolatile memory devices.

In a volatile memory device, a power turn-off may lead to a cancellation of stored data therein. A volatile memory device may include a static random access memory (SRAM), a dynamic RAM (DRAM), a synchronous DRAM (SDRAM) and the like. In a nonvolatile memory device, despite a power turn-off, the stored data may be maintained. A nonvolatile memory device may include read only memory (ROM), programmable ROM (PROM) electrically programmable ROM (EPROM), electrically erasable and programmable ROM (EEPROM), flash memory, phase-change RAM (PRAM) magnetic RAM (MRAM) resistive RAM (RRAM), ferroelectric RAM (FRAM) and the like. A flash memory may be classified into NOR and NAND architectures.

SUMMARY

Embodiments of the present disclosure are directed to a semiconductor memory device with an improved manufacturing yield.

In one aspect of the present disclosure, there is provided a semiconductor memory device including: a memory cell array including guarantee blocks, normal blocks, and redundancy blocks; a latch circuit configured to store a bad block address and indication information, wherein the bad block address indicates which block from the guarantee blocks and the normal blocks is defective and the indication information indicates whether the bad block address belongs to the guarantee blocks or to the normal blocks, a control logic configured to supply a request block address together with associated block type information, wherein the block type information indicates whether the request block address belongs to the guarantee blocks or to the normal blocks and a comparator configured to enable a match signal when the block type information matches the indication information, and the request block address matches the bad block address, wherein an enablement of the match signal allows the defective block to be replaced with one block from the redundancy blocks.

In an embodiment, the replacement of the defective block may be triggered by the match signal.

In an embodiment, the device may further include a repair address generation module configured to supply, in response to the match signal, a replacement block address indicating said one block.

In an embodiment, the device may further include an address decoder configured to select one block from the guarantee blocks, the normal blocks and the redundancy blocks, wherein, in place of the request block address, the replacement block address may be supplied to the address decoder, and wherein the address decoder may select said one block based on the replacement block address.

In an embodiment, the comparator may enable or disable the match signal based on whether the request block address and the bad block address match each other, when the indication information indicates that the bad block address belongs to the guarantee blocks, and the block type information indicates that the request block address belongs to the guarantee blocks.

In an embodiment, the comparator may disable the match signal regardless of whether the request block address and the bad block address match each other, when the indication information indicates that the bad block address belongs to the guarantee blocks, and the block type information indicates that the request block address belongs to the normal blocks.

In an embodiment, the comparator may disable the match signal regardless of whether the request block address and the bad block address match each other, when the indication information indicates that the bad block address belongs to the normal blocks, and the block type information indicates that the request block address belongs to the guarantee blocks.

In an embodiment, the comparator may enable or disable the match signal based on whether the request block address and the bad block address match each other, when the indication information indicates that the bad block address belongs to the normal blocks, and the block type information indicates that the request block address belongs to the normal blocks.

In an embodiment, the guarantee blocks may include: contents addressable memory (CAM) blocks storing therein set up information for the semiconductor memory device; and one time programmable (OTP) blocks, wherein the set up information may include the bad block address and the indication information.

In an embodiment, upon a power-up of the device, the bad block address and the indication information may be read from the CAM blocks, and the read bad block address and indication information may be latched in the latch circuit.

In one aspect of the present disclosure, there is provided a semiconductor memory device including: a memory cell array including guarantee blocks, normal blocks and redundancy blocks; a peripheral circuit configured to access at least one of the guarantee blocks, the normal blocks, and the redundancy blocks, and a control logic configured to supply to the peripheral circuit a request block address together with associated block type information, wherein the block type information indicates whether the request block address belongs to the guarantee blocks or to the normal blocks, wherein the peripheral circuit includes an address translator, wherein the address translator is configured: to store a bad block address and an indication information, wherein the bad block address indicates which block from the guarantee blocks and the normal blocks is defective, and the indication information indicates whether the bad block address belongs to the guarantee blocks or to the normal blocks; and to enable a match signal when the block type information matches the indication information, and the request block address matches the bad block address.

In an embodiment, a first guarantee block from the guarantee blocks may store the bad block address and the indication information, wherein the address translator may be further configured to receive the bad block address and the indication information from the first guarantee block.

In an embodiment, upon a power-up of the device, the control logic may be further configured to instruct the peripheral circuit to read the bad block address and the indication information from the first guarantee block, and to latch the read bad block address and the indication information into the address translator.

In an embodiment, after the latching of the read bad block address and the indication information into the address translator, the control logic may be further configured to instruct the peripheral circuit to read a second guarantee block from the guarantee blocks.

In an embodiment, the control logic may be further configured to supply the request block address and the block type information to the peripheral circuit to read the second guarantee block, wherein the request block address may indicate the second guarantee block, and the block type information may indicate that the request block address belongs to the guarantee blocks, wherein an enablement of the match signal may allow the peripheral circuit to read set up information from one block from the redundancy blocks in place of the second guarantee block.

In one aspect of the present disclosure there is provided a method of operating a semiconductor memory device, the device including a memory cell array including guarantee blocks, normal blocks and redundancy blocks, the method including: loading a bad block address and an indication information on the device, wherein the bad block address indicates which block from the guarantee blocks and the normal blocks is defective, and the indication information indicates whether the bad block address belongs to the guarantee blocks or to the normal blocks; supplying a request block address together with associated block type information, wherein the request block address is employed to access one block from the guarantee blocks and the normal blocks, and the block type information indicates whether the request block address belongs to the guarantee blocks or to the normal blocks; and accessing one block from the redundancy blocks in place of the defective block when the block type information matches the indication information, and the request block address matches the bad block address.

In an embodiment one block from the guarantee blocks may store therein the bad block address and the indication information.

In an embodiment, the loading may include: upon a power-up of the device, reading the bad block address and the indication information from said one block from the guarantee blocks; and latching the read bad block address and the indication information into a latch circuit in the device.

In an embodiment, wherein the supplying may include: after the latching, of the bad block address and the indication information into the latch circuit, supplying the request block address and the block type information, wherein the request block address may indicate another block from the guarantee blocks, and the block type information may indicate that the request block address belongs to the guarantee blocks, wherein the accessing may include: accessing and reading set up information for one block from the redundancy blocks in place of said another block when the block type information matches the indication information and the request block address matches the bad block address.

In an embodiment, the supplying may include: receiving the request block address from an external from the device; and supplying the request block address and the block type information.

In the present disclosure, the manufacturing yield of the semiconductor memory device may be enhanced.

DETAILED DESCRIPTIONS

Figure 1:
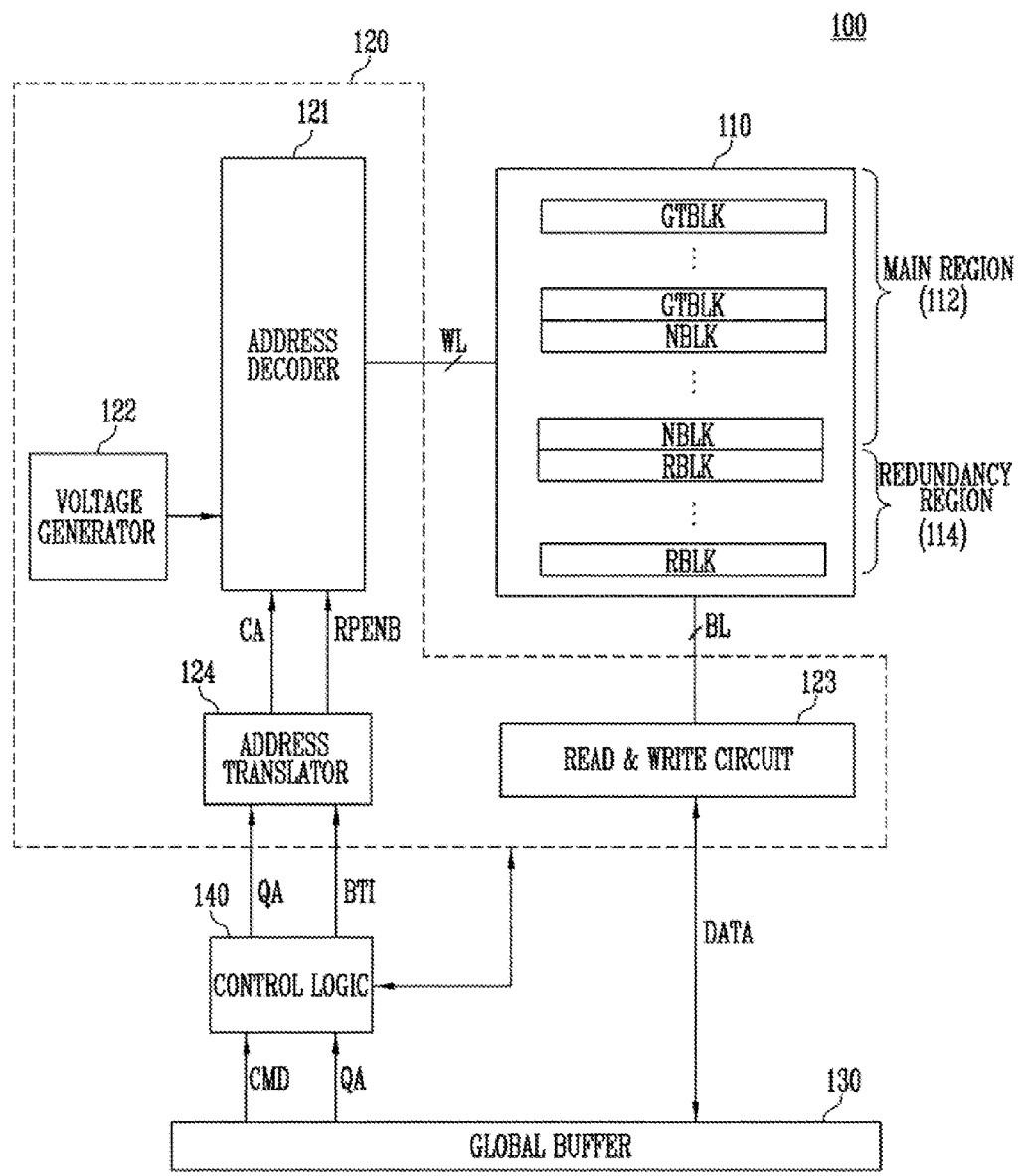
FIG. 1 is a block diagram illustrating a semiconductor memory device according to an embodiment of the present disclosure.

Examples of various embodiments are illustrated in the accompanying drawings and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element component, region, layer or section described below could be termed a second element, component, region, layer or section, without departing from the spirit and scope of the present disclosure.

It will be understood that when an element or layer is referred to as being "connected to" or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

FIG. 1 illustrates a block diagram of a semiconductor memory device 100, according to an embodiment of the preset disclosure.

Referring to FIG. 1, the semiconductor memory device 100 may include a memory cell array 110, a peripheral circuit 120, a global buffer 130 and a control logic 140.

The peripheral circuit 120 may include an address decoder 121, a voltage generator 122, a read and write circuit 123 and an address translator 124.

The memory cell array 110 may include a plurality of memory blocks GTBLK, NBLK, and RBLK. The plurality of memory blocks GTBLK, NBLK, and RBLK may be divided into a plurality of guarantee blocks GTBLK, a plurality of normal blocks NBLK and a plurality of redundancy blocks RBLK. The plurality of memory blocks GTBLK, NBLK, and RBLK may be coupled via word lines WL to the address decoder 121, and via bit lines BL to the read and write circuit 123. Each of the plurality of memory blocks GTBLK, NBLK, and RBLK may include a plurality of memory cells. The plurality of memory cells may be implemented as nonvolatile memory cells.

A combination of the plurality of memory blocks GTBLK, NBLK, and RBLK may be divided, into a main region 112 and a redundancy region 114. The main region may include the guarantee blocks GTBLK and normal blocks NBLK. The redundancy region may include the redundancy blocks RBLK.

The redundancy blocks RBLK may be employed to repair the main region. According to an embodiment of the present disclosure the redundancy blocks RBLK may replace not only the normal blocks NBLK but also the guarantee blocks GTBLK.

Although some of the normal blocks NBLK1 to NBLKn become defective a percentage of the defective normal blocks relative to an entirety of the normal blocks NBLK1 to NBLKn may be smaller than or equal to a given value. In this case, the semiconductor memory device 100 may be considered to be in a normal state. As it is well known by the skilled person to the art, a defective normal block may be considered as a bad block, and hence, may be replaced with a redundancy memory block RBLK. Alternatively, the defective normal block may not be replaced with a redundancy memory block RBLK and instead, may be considered as an invalid block.

When at least one of the guarantee blocks GTBLK is defective, the semiconductor memory device 100 may be considered to be in an abnormal state. Thus, replacement of the defective guarantee block or blocks GTBLK with one or more redundancy blocks RBLK may lead to an improved yield of the semiconductor memory device.

At least one of the guarantee blocks GTBLK may store therein defective block information. The defective block information may indicate which block or blocks of the memory blocks GTBLK, and NBLK in the main region 112 is defective. At a given time one or more memory blocks may be defective, hence, the number of defective block indicated by the defective block information may be singular or plural.

According to an embodiment of the present disclosure, a defective block information may include a bad block address to indicate a defective block, and an indication bit to indicate the type of the defective block. The indication bit may indicate whether a bad block address belongs to a group of guarantee blocks GTBLK or normal blocks NBLK.

The peripheral circuit 120 may access the guarantee blocks GTBLK, the normal blocks NBLK, and the redundancy blocks RBLK under the control of the control logic 140.

The address decoder 121 of the peripheral circuit 120 may be coupled via word lines WL to the memory cell array 110. The address decoder 121 may operate under the control of the control logic 140. The address decoder 121 may receive a translated address CA from the address translator 124.

The address decoder 121 may decode a block address from the translated address CA. The address decoder 121 may select at least one memory block of the memory cell array 110 based on the decoded block address.

The address decoder 121 may decode a column address from the translated address CA. The address decoder 121 may select a single word line from the word lines WL based on the decoded column address.

The address decoder 121 may decode a row address from the translated address CA. The address decoder 121 may send the decoded row address to the read and write circuit 123.

The address decoder 121 may include an address buffer, a block decoder, a column decoder, a row decoder, and so on.

The voltage generator 122 of the peripheral circuit 120 may generate various voltages required to operate the semiconductor memory device 100 using an external voltage supplied to the semiconductor memory device 100 from an external power supply. The voltage generator 122 may operate under the control of the control logic 140. The voltage generator 122 may generate an internal voltage by regulating an external voltage applied thereto. The generated internal voltage by the voltage generator 122 may be employed to drive the address decoder 121, the read and write circuit 123, the address translator 124, the global buffer 130 and/or the control logic 140.

The read and write circuit 123 of the peripheral circuit 120 may be coupled via the bit lines BL to the memory cell array 110. The read and write circuit 123 may operate under the control of the control logic 140.

The read and write circuit 123 may exchange data DATA with the global buffer 130. In a program mode, the read and write circuit 123 may receive and store data DATA via the global buffer 130, and may deliver the stored data DATA to bit lines among the bit lines BL, as indicated by the decoded row address. Then, the delivered data may be programmed into memory cells connected to a selected word line. In a read mode, the read and write circuit 123 may read data DATA from memory cells of the memory cell array 110 connected to a selected word line, and the read data DATA may be outputted to the global buffer 130.

In an embodiment, the read and rite circuit 123 may include page buffers or page registers.

The address translator 124 of the peripheral circuit 120 may store therein the defective block information. For example, the control logic 140 may instruct the peripheral circuit 120 to read the defective block information from one of the guarantee blocks at a power-up, and latch the read defective block information into the address translator 124. The defective block information may include a bad block address to indicate a defective block, and an indication bit to indicate whether the bad block address belongs to a group of guarantee blocks GTBLK or to a group of normal blocks NBLK.

The address translator 124 may receive a request address QA via the control logic 140 and output a translated address A. The request address QA may include a block address, a column address and a row address. The address translator 124 may supply not the block address in the request address QA (hereinafter, a request block address) but a replacement block address based on the defective block information latched therein. The replacement block address may indicate one of the redundancy blocks RBLK. This replacement block address may be supplied, as a block address in the translated address CA. Upon supply of the replacement block address, a memory block indicated by the request block address may be replaced with one of the redundancy blocks RBLK.

In an embodiment, the column address and the row address in the request address QA may be respectively supplied as the column address and the row address in the translated address CA. It will be understood that, in an embodiment, the row address in the request address QA may be replaced with another row address using various schemes.

According to an embodiment of the present disclosure the address translator 124 may further receive block type information BTI together with a reception of the request address QA. The address translator 124 may determine whether the block type information BTI matches the indication bit in the defective block information.

When the block type information BTI matches the indication bit, the address translator 124 may or may not supply the replacement block address based on a matching result between the request block address and the bad block address. For example, when the block type information BTI may indicate that the request block address belongs to a group of guarantee blocks GTBLK, and the indication bit may indicate that the bad block address belongs to a group of guarantee blocks GTBLK the address translator 124 may or may not supply the replacement block address depending on whether the request block address and the bad block address match each other.

In an embodiment, the address translator 124 may enable a replacement enable signal RPENB upon the supply of the replacement block address. The address decoder 121 may detect that the block address in the translated address CA may indicate one of the redundancy blocks RBLK upon the enablement of the replacement enable signal RPENB. For example, the address decoder 121 may decode the block address in the translated address CA and thus, may select one of the redundancy blocks RBLK based on the decoded block address. The address decoder 121 may detect that the block address in the translated address CA may indicate one of the guarantee blocks GTBLK and the normal blocks NBLK upon disablement of the replacement enable signal RPENB. For example, the address decoder 121 may decode the block address in the translated address CA and thus, may select one of the guarantee blocks GTBLK and the normal blocks NBLK based on the decoded block address.

The global buffer 130 may be connected to the peripheral circuit 120 and the control logic 140. The global buffer 130 may operate under the control of the control logic 140. The global buffer 130 may allow interfacing between the semiconductor memory device 100 and external devices.

The control logic 140 may be connected to the peripheral circuit 120 and the global buffer 130. The control logic 140 may receive' command CMD via the global buffer 130. The control logic 140 may control, in response to the command CMD, the address decoder 121, the voltage generator 122, the read and write circuit 123, the address translator 124 and/or the global buffer 130. The control logic 140 may receive the request address QA via the global buffer 130. The control logic 140 may deliver the request address QA to the address translator 124.

According to an embodiment of the present disclosure, the control logic 140 may supply block type information BTI together with the request address QA to the address translator 124. In an embodiment, the control logic 140 may detect that a memory block to be accessed based on the command CMD is a guarantee block GTBLK, and may generate the block type information BTI having a first value based on the detection result. In an embodiment, the control logic 140 may detect that a memory block to be accessed based on the command CMD is a normal block NBLK, and may generate the block type information BTI having a second value based on the detection result. In another embodiment, the control logic 140 may generate the block type information BTI by referencing the request address QA.

Figure 2:
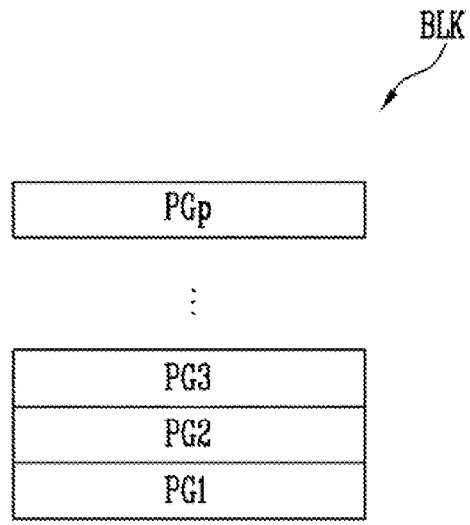
FIG. 2 is a schematic view of a memory block of the memory device of FIG. 1, according to an embodiment of the present disclosure.

FIG. 2 illustrates a schematic view of a memory block, according to an embodiment of the present disclosure. For example, the memory block of FIG. 2 may be one block BLK of the memory blocks GTBLK, NBLK, and RBLK in FIG. 1.

Referring to FIG. 2, a single memory block BLK may include a plurality of pages PG1 to PGp. A single page may include memory cells connected to a single word line. The semiconductor memory device 100 may be erased on a memory block basis. The semiconductor memory device 100 may be programmed or read on a page basis.

Figure 3:
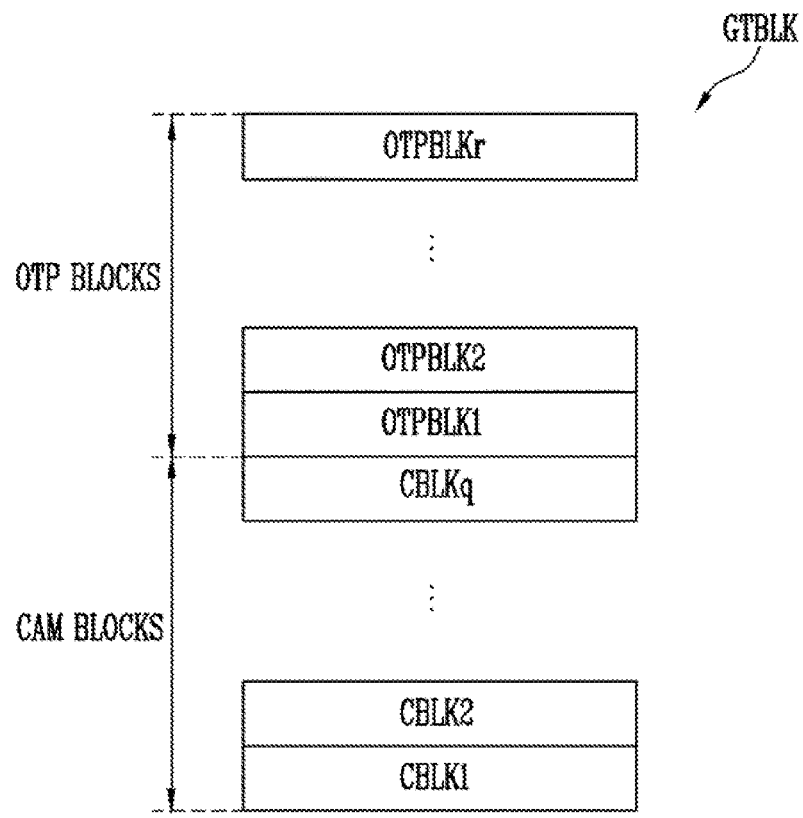
FIG. 3 is a schematic view of guarantee blocks, according to an embodiment of the present disclosure.

FIG. 3 illustrates a schematic view of guarantee blocks according to an embodiment of the present disclosure. For example, the guarantee blocks of FIG. 3 may be the guarantee blocks GTBLK in FIG. 1.

Referring to FIG. 3, the guarantee blocks GTBLK may include contents addressable memory (CAM) blocks CBLK1 to CBLKq and one time programmable (OTP) blocks OTPBLK1 to OTPBLKr.

The CAM blocks CBLK1 to CBLKq may store therein set up information for the semiconductor memory device 100 in FIG. 1. The set up information may include the defective block information as described above with reference to FIG. 1. The set up information may include not only the defective block information, but also information regarding levels of various voltages, algorithms, timings, defective row column, etc. relating to operations of the semiconductor memory device 100.

Set up information may be generated at various post-process tests for the semiconductor memory device 100. Set up information may be stored in the CAM blocks CBLK1 to CBLKq. For example, for the semiconductor memory device 100, a test may determine whether the memory blocks GTBLK, NBLK, RBLK become defective during a wafer-level process or package-level process. The test results may be stored as the set up information, into the CAM blocks CBLK1 to CBLKq.

In an embodiment, the defective block information may be stored in at least one of the CAM blocks CBLK1 to CBLKq. Remaining set up information may be stored in remaining CAM blocks.

The OTP blocks OTPBLK1 to OTPBLKr may be programmed only once. Hence, if memory cells of the OTP blocks OTPBLK1 to OTPBLKr have been programmed with data, they may not be re-programmed.

The OTP blocks OTPBLK1 to OTPBLKr may be programmed, and thereafter may be read in response to a request from an external controller. For example, the OTP blocks OTPBLK1 to OTPBLKr may be programmed at various post-process tests for the semiconductor memory device 100, and thereafter may be read in response to a request from an external controller. The OTP blocks OTP-BLK1 to OTPBLKr may be read in response to a program command, a read command and/or an erase command. The OTP blocks OTPBLK1 to OTPBLKr may be read in response to a special command other than a program command, a read command or an erase command. In an embodiment, the OTP blocks OTPBLK1 to OTPBLKr may be read in response to a program command, a read command, an erase command, and/or a special command other than a program, read or erase command. In an embodiment, the OTP blocks OTPBLK1 to OTPBLKr may not be read in response to a program command, a read command and/or an erase command, but may be read in response to a special command other than a program, read or erase command.

Figure 4:
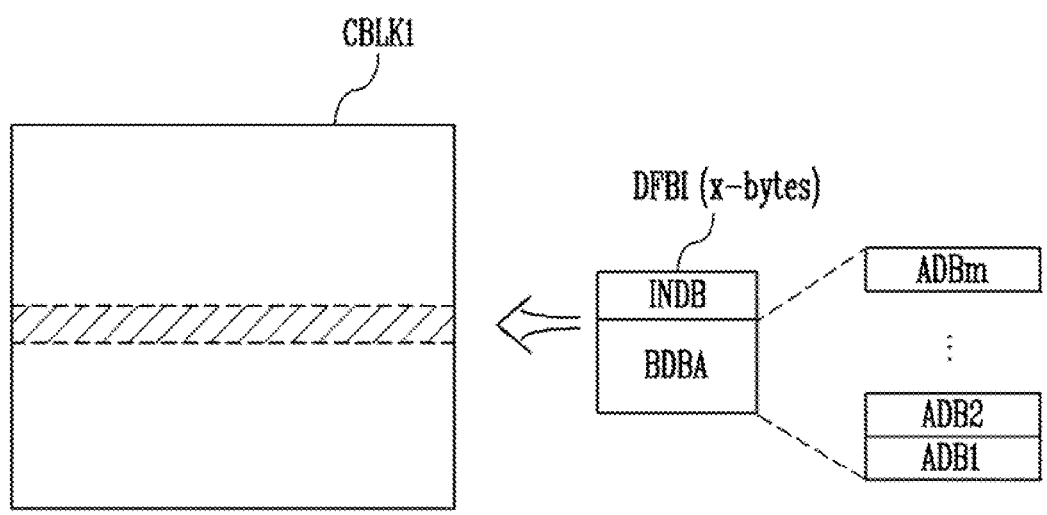
FIG. 4 is a schematic view of a CAM block storing therein defective block information, according to an embodiment of the present disclosure.

FIG. 4 is a schematic view of a CAM block storing defective block information DFBI according to an embodiment of the present disclosure. Hereinafter, as an example, it may be assumed that the CAM block storing the defective block information DFBI is the first CAM block CBLK1 out of the CAM blocks CBLK1 to CBLKq in FIG. 3.

Referring to FIG. 4, the first CAM block CBLK1 may store therein the defective block information DFBI. The first CAM block CBLK1 may store, in at least one page thereof, the defective block information DFBI.

The defective block information DFBI may include a bad block address BDBA indicating a defective block, and an indication bit INDB indicating whether the bad block address BDBA belongs to a group of guarantee blocks or to a group of normal blocks. The bad block address BDBA may have a plurality of data bits ADB1 to ADBm. The indication bit INDB may have at least one data bit. The defective block information DFBI may be stored on a x-bytes basis.

For example, when the indication bit INDB has a logic value "1", the bad block address BDBA may belong to a group of normal blocks NBLK. When the indication bit INDB has a logic value "0", the bad block address BDBA may belong to a group of guarantee blocks GTBLK.

When there is a plurality of defective blocks, a plurality of defective block information (e.g., DFBI1 to DFBIn in FIG. 6) may be supplied each defective block information having the same format as the defective block information DFBI as shown in FIG. 4.

A plurality of defective block information may be stored, for example, in the first CAM block CBLK1.

Upon a power-up of the semiconductor memory device 100, the defective block information DFBI may be read from the first CAM block CBLK1, and then the read defective block information DFBI may be latched in the address translator 124.

Figure 5:
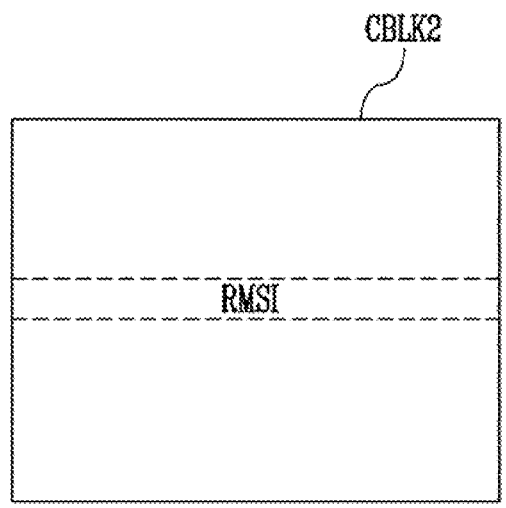
FIG. 5 is a schematic view of a CAM block storing therein remaining setting information, according to an embodiment of the present disclosure.

FIG. 5 is a schematic view of a CAM block storing therein remaining set up information RMSI, according to an embodiment of the present disclosure. Hereinafter, as an example, it may be assumed that a CAM block storing the remaining set up information RMSI may be a second CAM block. CBLK2 of the CAM blocks CBLK1 to CBLKq in FIG. 3. Also, the remaining set up information RMSI may refer to set up information except for the defective block information DFBI.

Referring to FIG. 5, the remaining set up information RMSI may be stored in the second CAM block CBLK2. The remaining set up information RMSI may include information about levels of various voltages, algorithms, timings, defective row column, etc. relating to operations of the semiconductor memory device 100 in FIG. 1. The remaining set up information RMSI may be stored in at least one page of the second CAM block CBLK2.

Figure 6:
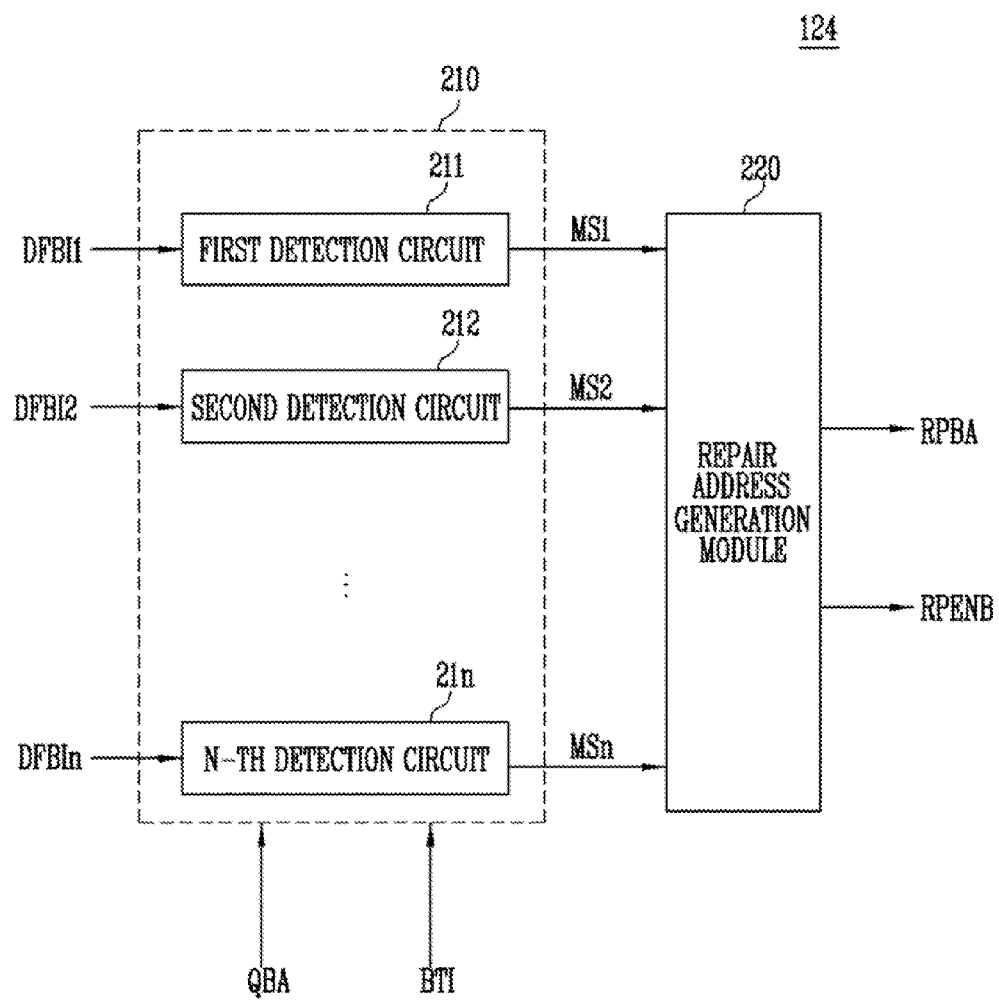
FIG. 6 is a block diagram of an address translator, according to an embodiment of the present disclosure.

Upon a power-up of the semiconductor memory device 100, after the defective block information DFBI has been latched into the address translator 124, the remaining set, up information RMSI may be read from the second CAM block CBLK2, and may be stored in a register in the semiconductor memory device 100. The control logic 140 of FIG. 1 may control one or more operations of the semiconductor memory device 100 by referencing the data stored in the register. In an embodiment, the control logic 140 of FIG. 1 may control all operations of the semiconductor memory device 100 by referencing the data stored in the register FIG. 6 is a block diagram of an address translator, according to an embodiment of the present disclosure. For example, the address translator of FIG. 6 may be the address translator 124 in FIG. 1.

Referring to FIG. 1 and FIG. 6, the address translator 124 may include a detector 210, and a repair address generation module 220.

The detector 210 may receive a request block address QBA in the request address QA, and block type information BTI. Although not shown in FIG. 6, a column address and a row address in the request address QA may be respectively supplied as a column address and a row address in a translated address CA. Alternatively, the row address in the request address QA may be replaced with another row address using various schemes.

The detector 210 may include first to n-th detection circuits 211 to 21n. All of the first to n-th detection circuits 211 to 21n may receive the request block address QBA and the block type information BTI. The first to n-th detection circuits 211 to 21n may receive first to n-th defective block information DFBI1 to DFBIn, respectively.

Each of the first to n-th detection circuits 211 to 21n may compare the request block address QBA and the block type information BTI with associated defective block information. Based on the comparisons, the first to n-th detection circuits 211 to 21n may generate first to n-th match signals MS1 to MSn, respectively.

More specifically, a determination may be made whether the block type information BTI matches the indication bit INDB in the defective block information. For example, a determination may be made whether the block type information BTI and the indication bit INDB have an identical logic value. When the block type information BTI matches the indication bit INDB, it may be further determined whether the request block address QBA matches the bad block address BABA in the defective block information. For a positive matching result, a match signal may be enabled.

The repair address generation module 220 may receive first to n-th match signals MS1 to MSn, and may output a repair block address RPBA and a replacement enable signal RPENB. The repair block address RPBA and replacement enable signal RPENB may be sent to the address decoder 121, as described above with reference to FIG. 1.

The repair address generation module 220 may output the repair block address RPBA upon enablement of one of the first to n-th match signals MS1 to MSn. In an embodiment, which match signal of the match signals MS1 to MSn is to be enabled may determine which repair block address RPBA is to be outputted. In other words, a correspondence between the defective block information DFBI1 to DFBIn and the repair block addresses RPBA may be preset.

The repair address generation module 220 may enable the replacement enable signal RPENB upon enablement of one of the first to n-th match signals MS1 to MSn. Supply of the replacement enable signal RPENB to the decoder 121 may allow the address decoder 121 to detect that the repair block address RPBA may indicate one of the redundancy blocks RBLK. In other words, when the replacement enable signal RPENB is enabled, a memory block indicated by the request block address QBA may be replaced with one of the redundancy blocks RBLK.

When all of the first to n-th match signals MS1 to MSn are disabled, the request block address QBA itself may be outputted, and thus the replacement enable signal RPENB may be disabled.

The guarantee blocks GTBLK may have identical block addresses with some of the normal blocks NBLK. For example, the first to q-th CAM blocks CBLK1 to CBLKq and/or the first to r-th OTP blocks OTPBLK1 to OTPBLKr in FIG. 3 may have identical block addresses with the first to q+r-th normal blocks, respectively.

The indication bit INDB and the block type information BTI may not be provided. In such a scenario, a request block address QBA matching a bad block address BDBA may mean either that the defective block belongs to the guarantee blocks GBLK, or that the defective block belongs to the normal blocks NBLK. In other words, it may be unclear whether a memory block indicated by the request block address QBA belongs to the guarantee blocks or to the normal blocks. In this case, in an embodiment, the request block address QBA may be considered to indicate one of the normal blocks NBLK which may then be replaced with one of the redundancy blocks RBLK. Hence, according to this approach, when one of the guarantee blocks GBLK is defective, one of the guarantee blocks may not be replaced with a redundancy block.

According to an embodiment of the present disclosure, the indication bit INDB as the indication information and the block type information BTI may be provided. In such an embodiment, by determining whether the indication bit INDB and the block type information BTI match each other, when the request block address QBA may indicate the defective block, a determination may be made whether a defective block indicated by the request block address QBA belongs to the guarantee blocks or to the normal blocks. Therefore, the possibility of not replacing a defective guarantee block GBLK with a redundancy block may be reduced or eliminated by using two kinds of information, namely an indication bit INDB, and a block type information BTI.

Figure 7:
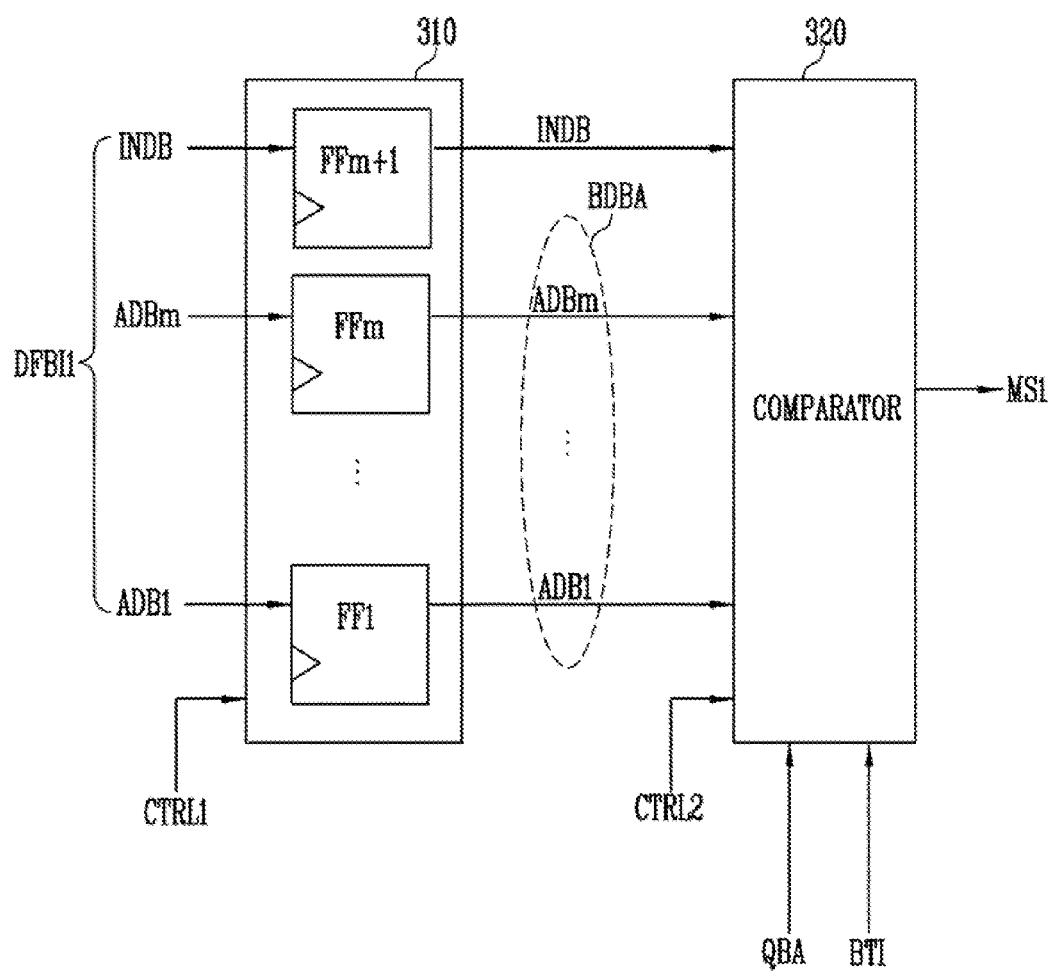
FIG. 7 is a block diagram of a detection circuit, according to an embodiment of the present disclosure.

FIG. 7 is a block diagram of a detection circuit 211 according to an embodiment of the present disclosure. For example, the detection circuit 211 may be one of the detection circuits 211 to 21n of FIG. 6.

Referring to FIG. 7, the detection circuit 211 may include a latch circuit 310 and a comparator 320. The latch circuit 310 may receive the defective block information DFBI1. The defective block information DFBI1 may include first to m-th data bits ADB1 to ADBm and the indication bit INDB as described above with reference to FIG. 4. The latch circuit 310 may operate in response to a first control signal CTRL1 from the control logic 140 in FIG. 1.

The latch circuit 310 may include first to m+1-th flip-flops FF1 to FFm+1. The first to m-th flip-flops FF1 to FFm may respectively receive the first to m-th data bits ADB1 to ADBm. In response to the first control signal CTRL1, the first to m-th flip-flops FF1 to FFm may latch and output the first to m-th data bits ADB1 to ADBm. For example, flip-flop FFm+1 may receive the indication bit INDB. In response to the first control signal CTRL1, the (m+1)-th flip-flop FFm+1 may latch and output the indication bit INDB.

The first to m-th flip-flops FF1 to FFm may output the first to m-th data bits ADB1 to ADBm, respectively, to the comparator 320. The first to m-th data bits ADB1 to ADBm may form a bad block address BDBA. The (m+1)-th flip-flop FFm+1 may output the indication bit INDB to the comparator 320.

The comparator 320 may receive the request block address QBA and the block type information BTI from the control logic 140 of FIG. 1. The comparator 320 may operate in response to a second control signal CTRL2 from the control logic 140.

The comparator 320 may compare between the block type information BTI and the indication bit INDB, and between the request block address QBA and the bad block address BDBA, and to enable a match signal MS1 when the block type information BTI and the request block address QBA match with the indication bit INDB and the bad block address BDBA, respectively. Enablement of the match signal MS1 may then trigger replacing the memory block indicated by the request block address QBA with one of the redundancy blocks RBLK of FIG. 1.

In an embodiment, when the block type information BTI and the indication bit INDB have an identical logic value, the match signal MS1 may be enabled or disabled depending on whether the request block address QBA matches the bad block address BDBA.

For example, when the block type information BTI may indicate that the request block address QBA belongs to a group of guarantee blocks GTBLK, and the indication bit INDB may indicate that the bad block address BDBA belongs to a group of guarantee blocks GTBLK, the match signal MS1 may be enabled or disabled depending on whether the request block address QBA matches the bad block address BDBA.

For example, when the block type information BTI may indicate that the request block address QBA belongs to a group of guarantee blocks GTBLK, and when the indication bit INDB may indicate that the bad block address BDBA belongs to a group of normal blocks NBLK, the match signal MS1 may be disabled regardless of whether the request block address QBA matches the bad block address BDBA.

For example, when the block type information BTI may indicate that the request block address QBA belongs to a group of normal blocks NBLK, and when the indication bit INDB may indicate that the bad block address BDBA belongs to a group of guarantee blocks GTBLK, the match signal MS1 may be disabled regardless of whether the request block address QBA matches the bad block address BDBA.

For example, when the block type information BTI may indicate that the request block address QBA belongs to a group of normal blocks NBLK, and when the indication bit INDB may indicate that the bad block address BDBA belongs to a group of normal blocks NBLK, the match signal MS1 may be enabled or disabled depending on whether the request block address QBA matches the bad block address BDBA.

Figure 8:
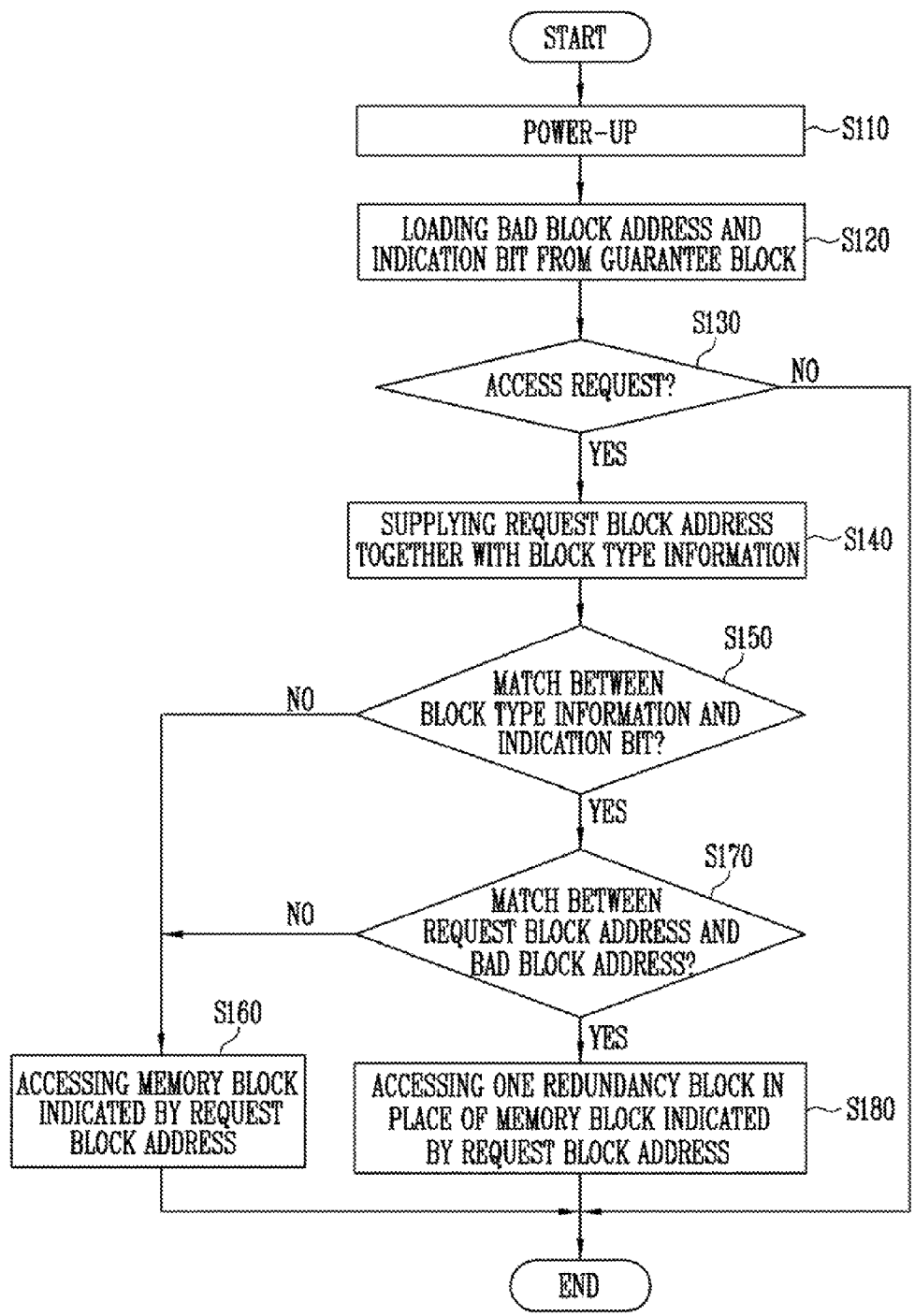
FIG. 8 is a flow chart of a method of operating a semiconductor memory device, according to an embodiment of the present disclosure.

FIG. 8 is a flow chart of a method of operating a semiconductor memory device, according to an embodiment of the present disclosure. For example, the semiconductor memory device of FIG. 8 may be the semiconductor memory device 100 of FIG. 1. The operations of FIG. 8 may be performed by the address decoder 121, the address translator 124 and the control logic 140.

Referring to FIGS. 1 and 8, at step S110, the semiconductor memory device 100 may be powered-up. In a power-up, the semiconductor memory device 100 may perform an initialization.

At S120, a bad block address BDBA and an indication bit INDB in FIG. 4 may be loaded from a guarantee block GTBLK. For example, the control logic 140 may instruct the peripheral circuit 120 to read the bad block address BDBA and the indication bit INDB, and to latch the read bad block address BDBA and indication bit INDB into the address translator 124.

At S130, based on whether an access to the memory cell array 110 is requested the method may or may not proceed to S140. If an access request to the memory cell array 110 has been made, the method, may then proceed to S140. At S140, a request block address QBA associated with the access request, and corresponding block type information BTI may be supplied.

At S150, a determination may be made whether the block type information BTI matches the indication bit INDB. For example, a determination may be made whether the block type information BTI and the indication bit INDB have an identical logic value.

A mismatch between the block type information BTI and the indication bit INDB may mean a difference in the type between a memory block indicated by the request block address QBA and a defective block indicated by the bad block address BDBA. In case of a mismatch, regardless of whether the request block address QBA and the bad block information BDBA match each other, a replacement for the defective block may not be carried out. In this case, the method may proceed to S160. At S160, the memory block indicated by the request block address QBA may be accessed. The request block address QBA may be supplied as a block address of a translated address CA.

A match between the block type information BTI and the indication bit INDB may mean an identity in the type between a memory block indicated by the request block address QBA and a defective block indicated by the bad block address BDBA. In case of a match, the method may proceed to S170.

At S170, a determination may be made whether the request block address QBA and the bad block address BDBA match. A mismatch between the request block address QBA and the bad block address BDBA may mean that a memory block to be accessed is not defective. In case of a mismatch between the request block address QBA and the bad block address BDBA, the method may proceed to S160. A match between the request block address QBA and the bad block address BDBA may mean that a memory block to be accessed is defective. In case of a match between the request block address QBA and the bad block address BDBA, the method may proceed to S180.

At S180, in place of the memory block indicated by the request block address QBA, an associated redundancy block of the redundancy blocks RBLK may be accessed. In place of the request block address QBA, the repair block address RPBA of FIG. 6 may be supplied as a block address of the translated address CA. Upon the supply of the repair block address RPBA, a replacement enable signal RPENB of FIG. 6 may be enabled. Thus, a memory block indicated by the repair block address RPBA may be accessed.

Figure 9:
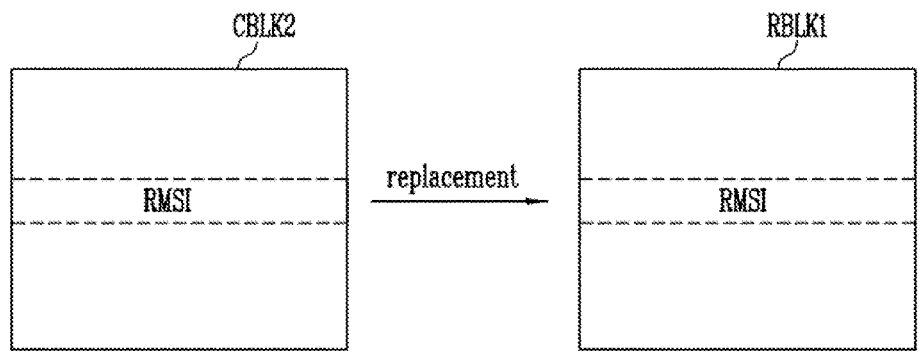
FIG. 9 is a schematic view for a replacement of a CAM block with a redundancy block, according to an embodiment of the present disclosure.

FIG. 9 is a schematic view illustrating a replacement of a CAM block with a redundancy block, according to an embodiment of the present disclosure. By way of example, it is illustrated that a second CAM block CBLK2 storing therein remaining set up information RMSI is replaced with a first redundancy block RBLK1 of the redundancy blocks RBLK.

During a post-process testing for the semiconductor memory device 100, a test may be performed to determine whether the second CAM block CBLK2 is defective, and then, based on the test result, the remaining set up information RMSI may be stored in the first redundancy block RBLK1 in place of the second CAM block CBLK2.

Thereafter, in accessing the second CAM block CBLK2, the request block address QBA of FIG. 6 and FIG. 7 may indicate the second CAM block CBLK2. For example, in place of the request block address QBA, the replacement block address RPBA indicating the first redundancy block RBLK1 may be supplied.

To this end, the semiconductor memory device 100 may perform an initialization as described below in a power-up thereof.

Figure 10:
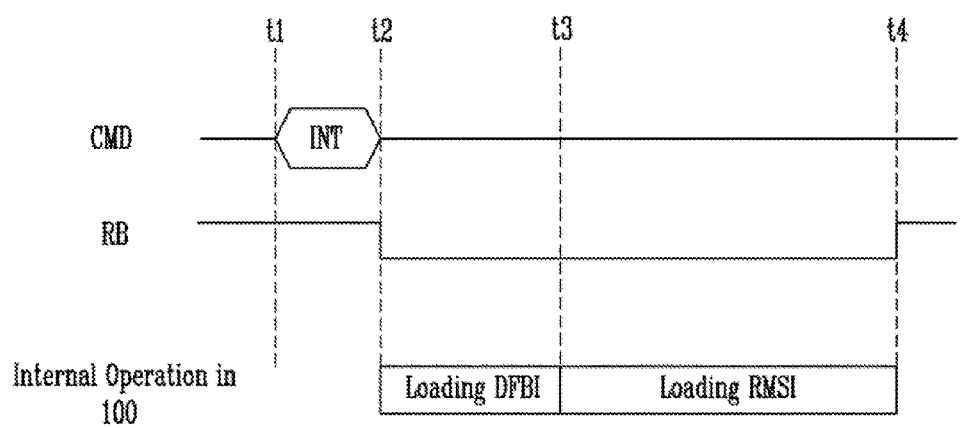
FIG. 10 is a timing diagram for an initialization operation of a semiconductor memory device, according to an embodiment of the present disclosure.

FIG. 10 is a timing diagram for an initialization operation of a semiconductor memory device, according to an embodiment of the present disclosure. For example, the semiconductor memory device of FIG. 10 may be the semiconductor memory device 100 of FIG. 1.

Referring to FIGS. 1 and 10, at a time t1, an initialization command INT may be inputted as a command CMD. The initialization command INT may be supplied by an external controller at a power-up of the semiconductor memory device 100.

At a time t2, in response to the initialization command INT, the semiconductor memory device 100 may perform an initialization. The semiconductor memory device 100 may enable a ready-busy signal RB with a logic value. For example, this may indicate that the semiconductor memory device 100 may be operating internally and be in a busy state.

First, the semiconductor memory device 100 may load, defective block information DFBI thereon. For example, the control logic 140 may instruct the peripheral circuit 120 to read the defective block information DFBI from a block (e.g., CBLK1 in FIG. 4) and to latch the read defective block information DFBI into the address translator 124.

As an example, t may be assumed that a second CAM block CBLK2 may be defective. Thus, the defective block information DFBI may indicate the second CAM block CBLK2. In other words, the bad block address BDBA may indicate the second CAM block CBLK2, and the indication bit INDB may indicate that the bad block address BDBA belongs to a group of guarantee blocks GTBLK.

At a time t3, the semiconductor memory device 100 may load remaining set up information RMSI thereon. For example, loading of the remaining set up information RMSI, may occur after the defective block information DFBI has been latched into the address translator 124.

The control logic 140 may control the peripheral circuit 120 to read the second CAM block CBLK2. For example, the control logic 140 may generate a request block address QBA corresponding to the second CAM block CBLK2 and associated block type information BTI. When the block type information BTI and the request block address QBA match the indication bit INDB and the bad block address BDBA, respectively, the address translator 124 may supply a replacement block address RPBA. The replacement block address RPBA may indicate a first redundancy block RBLK1 of FIG. 9. Upon supply of the replacement block address RPBA, the remaining set up information RMSI may be read from the first redundancy block RBLK1.

At a time t4, upon the completion of the loading of the remaining set up information RMSI, the ready-busy signal RB may be disabled.

According to an embodiment of the present disclosure, reading of the defective block information DFBI may be performed prior to the reading of remaining set up information RMSI. Thus, although a CAM block storing the remaining set up information RMSI may be defective, this CAM block may be replaced with a redundancy block. This may lead to an enhanced yield of the semiconductor memory device 100.

Figure 11:
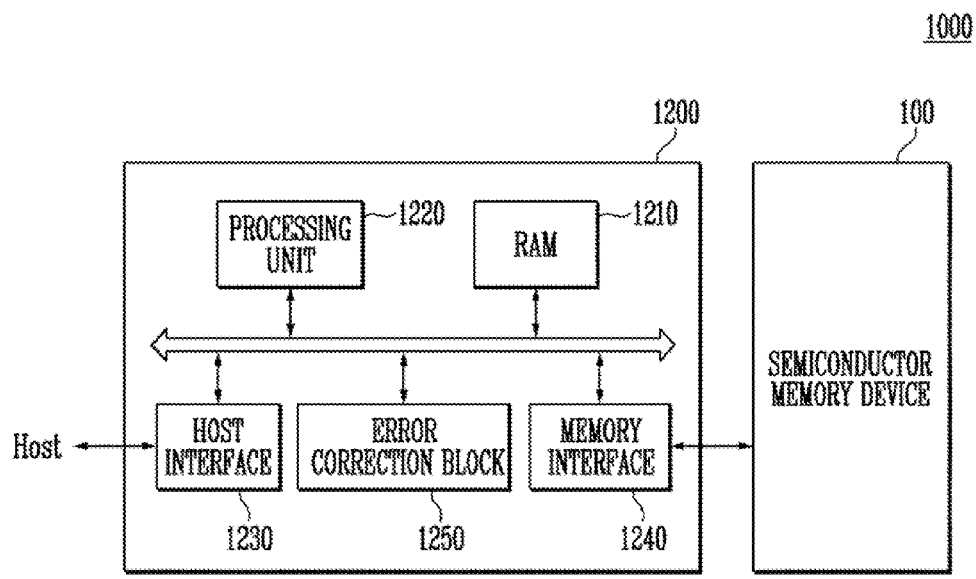
FIG. 11 is a block diagram of a memory system including a semiconductor memory device, according to an embodiment of the present disclosure.

FIG. 11 is a block diagram of a memory system including a semiconductor memory device, according to an embodiment of the present disclosure. For example, the semiconductor memory device of FIG. 11 may be the semiconductor memory device 100 in FIG. 1.

Referring to FIG. 11, the memory system 1000 may include the semiconductor memory device 100 and a controller 1200.

Configuration and operation of the semiconductor memory device 100 may be as described above in connection to FIG. 1. Thus, detailed description of the semiconductor device 100 is not repeated.

The controller 1200 may be connected to a host (not shown) and the semiconductor memory device 100. In response to a request from the host, the controller 1200 may access the semiconductor memory device 100. In an example, the controller 1200 may control read, write, erase, and background operations of the semiconductor memory device 100. The controller 1200 may interface between the semiconductor memory device 100 and the host. The controller 1200 may drive firmware to control the semiconductor memory device 100.

The controller 1200 may include a random access memory (RAM) 1210, a processing unit 1220, a host interface 1230, a memory interface 1240, and an error correction block 1250.

The RAM 1210 may act as a working memory of the processing unit 1220, a cache memory between the semiconductor memory device 100 and the host and/or a buffer memory between the semiconductor memory device 100 and the host.

The processing unit 1220 may control one or more operations of the controller 1200. The processing unit 1220 may control all operations of the controller 1200.

The host interface 1230 may include a protocol used to exchange data between the host and the controller 1200. The controller 1200 may be configured with the host via various interface protocols. An interface protocol may include, but not be limited to, a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol and/or the like.

The memory interface 1240 may interface with the semiconductor memory device 100. For example, the memory interface may be a NAND interface or NOR interface.

The error correction block 1250 may detect and correct an error in data received from the semiconductor memory device 100 using an error correction code (ECC).

The controller 1200 and the semiconductor memory device 100 may be integrated into a single semiconductor device. In one implementation the controller 1200 and the semiconductor memory device 100 may be integrated into a single semiconductor device to form a memory card such as a PC card (e.g., personal computer memory card international association (PCMCIA)), compact flash (CF) card smart media (SM) card (SMC), memory stick, multimedia card (e.g., MMC, RS-MMC, MMCmicro), SD card (e.g., SD, miniSD, microSD, SDHC), a universal flash memory device (UFS), and/or the like.

The integration of the controller 1200 and the semiconductor memory device 100 into the single semiconductor device may implement a semiconductor drive (e.g., solid state drive (SSD)). The semiconductor drive (SSD) may refer to a storage device configured to store data in the semiconductor memory. When the memory system 1000 is implemented as the semiconductor drive (SSD), this may lead to a considerable enhancement in an operation rate of the host system coupled to the memory system 1000.

In an embodiment, the memory system 1000 may be provided as one component in an electronic device. Examples of electronic devices may include a computer, Ultra Mobile PC (UMPC), workstation, net-book, Personal Digital Assistants (PDA), portable computer, web tablet, wireless phone, mobile phone, smart phone, e-book, portable multimedia player (PMP), portable game player, navigation device, black box, digital camera, 3-dimensional television, digital audio recorder, digital audio player, digital picture recorder, digital picture player, digital video recorder, digital video player, device with a wireless data communication, at least one electronic device as a home networking component, at least one electronic device as a computer networking component, at least one electronic device as a telematics networking component, at least one electronic device as a computing system component, at least one electronic device as a RIFD device component, and/or the like.

In one implementation, the semiconductor memory device 100 or memory system 1000 may be packaged in various forms. For example, such packages may include, but be not limited to, PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (FP), Wafer-Level Processed Stack Package (WSP) and/or the like.

Figure 12:
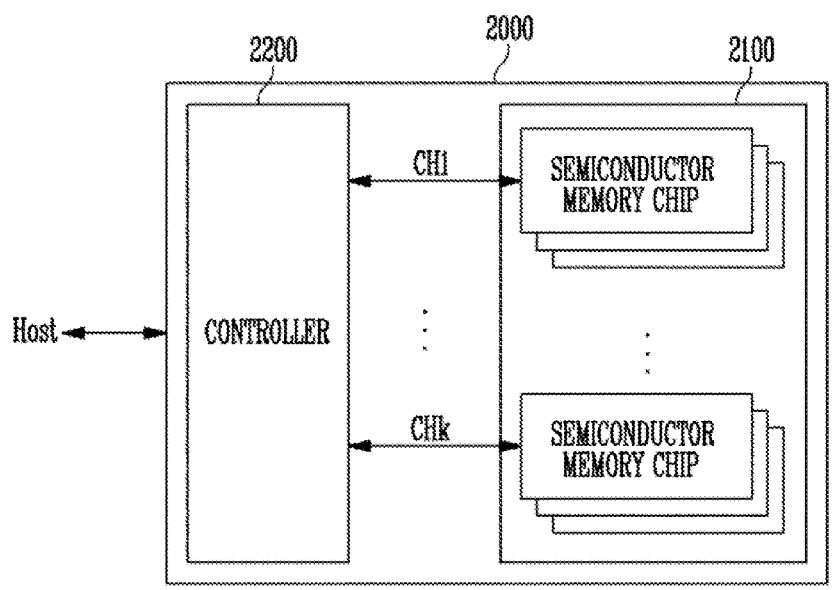
FIG. 12 is a block diagram illustrating one application of a memory system, according to an embodiment of the present disclosure.

FIG. 12 is a block diagram illustrating one application of a memory system, according to an embodiment of the present disclosure. For example, the memory system 2000 of FIG. 12 may be corresponding to the memory system 1000 of FIG. 11.

Referring to FIG. 12, the memory system 2000 may include a semiconductor memory device 2100 and a controller 2200. The semiconductor memory device 2100 may include a plurality of the semiconductor memory chips. The plurality of the semiconductor memory chips may be divided into a plurality of groups.

In one example, the plurality of groups may communicate via corresponding first to k-th channels CH1 to CHk with the controller 2200. Each of the semiconductor memory chips may have the same configuration and operation as in the semiconductor memory device 100 in FIG. 1.

Each group may communicate via a single common channel with the controller 2200. The controller 2200 may have the same configuration and operation as in the controller 1200 in FIG. 11. The controller 2200 may control the plurality of memory chips of the semiconductor memory device 2100 via the plurality of channels CH1 to CHk.

Figure 13:
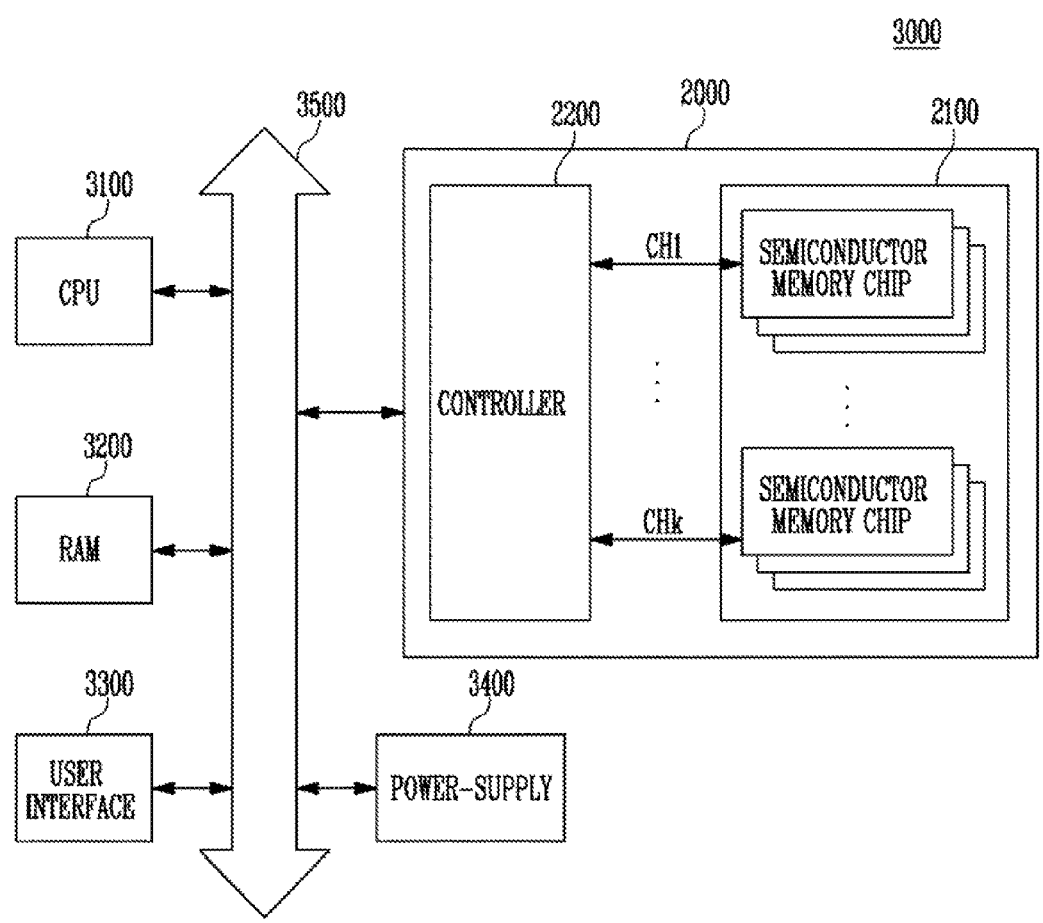
FIG. 13 is a block diagram of a computing system including a memory system, according to an embodiment of the present disclosure.

FIG. 13 is a block diagram of a computing system including a memory system, according to an embodiment of the present disclosure. For example, a computing system 3000 may include the memory system 2000 in FIG. 12.

Referring to FIG. 13, the computing system 3000 may include a central processing unit (CPU) 3100, a random access memory (RAM) 3200, a user interface 3300, a power-supply 3400, a system bus 3500, and the memory system 2000.

The memory system 2000 may be electrically connected via the system bus 3500 to the CPU 3100, the RAM 3200, the user interface 3300, and the power-supply 3400. Data may be supplied via the user interface 3300 or may be processed by the CPU 3100 and then may be stored in the memory system 2000.

In FIG. 13, the semiconductor memory device 2100 connected via the controller 2200 to the system bus 3500. However, the present disclosure is not limited thereto. In one example, the semiconductor memory device 2100 may be directly coupled to the system bus 3500. In this case, functions of the controller 2200 may be covered by the CPU 3100 and the RAM 3200.

It may be appreciated that, although in FIG. 13, the memory system 2000 has a configuration as above illustrated in FIG. 12, the memory system 2000 may be replaced with the memory system 1000 as illustrated above in FIG. 11. In one implementation, the computing system 3000 may include a combination of the memory systems 1000, and 2000 in FIGS. 11 and 12 respectively.

According to an embodiment of the present disclosure, an indication bit and a block type information may be provided. Thus, an enhanced yield of the device by the replacement of a defective guarantee block with a redundancy block may be achieved. Also, replacement of a defective block with a redundancy block may be simplified and become more predictable.

The above description is not to be taken in a limiting sense, but is made merely for the purpose of describing the general principles of exemplary embodiments, many additional embodiments of this invention are possible. It is understood that no limitation of the scope of the invention is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least an embodiment of the present disclosure. Thus, appearances of the phrases "in an embodiment," "in an embodiment," and similar language throughout this specification may, but do not necessarily, all refer to the same embodiment.

Many additional embodiments of this present disclosure are possible and will be envisaged by those skilled in this art after having read the present disclosure without departing from the spirit and scope of the invention as defined by the appended claims.

What is claimed is:

1. A semiconductor memory device comprising:
   a memory cell array including guarantee blocks, normal blocks, and redundancy blocks;
   a latch circuit configured to store a bad block address and indication information, wherein the bad block address indicates which block from the guarantee blocks and the normal blocks is defective, and the indication information indicates whether the bad block address belongs to the guarantee blocks or to the normal blocks;
a control logic configured to supply a request block address together with associated block type information, wherein the block type information indicates whether the request block address belongs to the guarantee blocks or to the normal blocks; and
a comparator configured to enable a match signal when the block type information matches the indication information, and the request block address matches the bad block address, wherein an enablement of the match signal allows the defective block to be replaced with one block from the redundancy blocks.

2. The device of claim 1, wherein the replacement of the defective block is triggered by the enablement of the match signal.

3. The device of claim 1, further comprising:
a repair address generation module configured to supply, in response to the enablement of the match signal, a replacement block address indicating said one block.

4. The device of claim 3, further comprising:
an address decoder configured to select one block from the guarantee blocks, the normal blocks and the redundancy blocks,
wherein, in place of the request block address, the replacement block address is supplied to the address decoder upon the enablement of the match signal, and
wherein the address decoder selects said one block based on the replacement block address.

5. The device of claim 1, wherein the comparator is configured to enable or disable the match signal based on whether the request block address and the bad block address match each other, when the indication information indicates that the bad block address belongs to the guarantee blocks, and the block type information indicates that the request block address belongs to the guarantee blocks.

6. The device of claim 1, wherein the comparator is configured to disable the match signal regardless of whether the request block address and the bad block address match each other, when the indication information indicates that the bad block address belongs to the guarantee blocks, and the block type information indicates that the request block address belongs to the normal blocks.

7. The device of claim 1, wherein the comparator is configured to disable the match signal regardless of whether the request block address and the bad block address match each other,
when the indication information indicates that the bad block address belongs to the normal blocks, and the block type information indicates that the request block address belongs to the guarantee blocks.

8. The device of claim 1, wherein the comparator is configured to enable or disable the match signal based on whether the request block address and the bad block address match each other, when the indication information indicates that the bad block address belongs to the normal blocks, and the block type information indicates that the request block address belongs to the normal blocks.

9. The device of claim wherein the guarantee blocks comprises:
contents addressable memory (CAM) blocks storing therein set up information for the semiconductor memory device; and
one time programmable (OTP) blocks,
wherein the set up information includes the bad block address and the indication information.

10. The device of claim 9, wherein upon a power-up of the device, the bad block address and the indication information are read from the CAM blocks, and the read bad block address and indication information are latched in the latch circuit.

11. A semiconductor memory device comprising:
a memory cell array including a plurality of guarantee blocks, normal blocks and redundancy blocks;
a peripheral circuit configured to access at least one of the guarantee blocks, the normal blocks, and the redundancy blocks; and
a control logic configured to supply to the peripheral circuit a request block address together with associated block type information, wherein the block type information indicates whether the request block address belongs to the guarantee blocks or to the normal blocks,
wherein the peripheral circuit comprises an address translator,
wherein the address translator is configured:
to store a bad block address and an indication information, wherein the bad block address indicates which block from the guarantee blocks and the normal blocks is defective, and the indication information indicates whether the bad block address belongs to the guarantee blocks or to the normal blocks; and
to enable a match signal when the block, type information matches the indication information and the request block address matches the had block address.

12. The device of claim 11, wherein a first guarantee block from the guarantee blocks stores the bad block address and the indication information, wherein the address translator is further configured to receive the bad block address and the indication information from the first guarantee block.

13. The device of claim 12, wherein upon a power-up of the device, the control logic is further configured to instruct the peripheral circuit to read the bad block address and the indication information from the first guarantee block, and to latch the read bad block address and the indication information into the address translator.

14. The device of claim 13, wherein after the latching of the read bad block address and the indication information into the address translator, the control logic is further configured to instruct the peripheral circuit to read a second guarantee block from the guarantee blocks.

15. The device of claim 14, wherein the control logic is further configured to supply the request block address and the block type information to the peripheral circuit to read the second guarantee block, wherein the request block address indicates the second guarantee block, and the block type information indicates that the request block address belongs to the guarantee blocks,
wherein the enablement of the match signal allows the peripheral circuit to read set up information from one block from the redundancy blocks in place of the second guarantee block.

16. A method of operating a semiconductor memory device, the device including a memory cell array including guarantee blocks, normal blocks and redundancy blocks, the method comprising:
loading a had block address and an indication information on the device, wherein the bad block address indicates which block from the guarantee blocks and the normal blocks is defective, and the indication information indicates whether the bad block address belongs to the guarantee blocks or to the normal blocks;
supplying a request block address together with associated block type information, wherein the request block, address is employed to access one block from the guarantee blocks and the normal blocks, and the block type information indicates whether the request block address belongs to the guarantee blocks or to the normal blocks; and accessing one block from the redundancy blocks in place of the defective block when the block type information matches the indication information, and the request block address matches the bad block address.

17. The method of claim 16, wherein one block from the guarantee blocks stores therein the bad block address and the indication information.

18. The method of claim 17, wherein the loading comprises:

upon a power-up of the device reading the bad block address and the indication information from said one block from the guarantee blocks; and latching the read bad block address and the indication information into a latch circuit in the device.

19. The method of claim 18, wherein the supplying of the request block address together with associated block type information comprises:

after the latching of the bad block address and the indication information into the latch circuit, supplying the request block address and the block type information, wherein the request block address indicates another block from the guarantee blocks, and the block type information indicates that the request block address belongs to the guarantee blocks, wherein the accessing of one block from the redundancy blocks comprises:

accessing and reading set up information for one block from the redundancy blocks in place of said another block when the block type information matches the indication information, and the request block address matches the bad block address.

20. The method of claim 16, wherein the supplying of the request block address together with associated block type information comprises:

receiving the request block address from an external from the device; and supplying the request block address and the block type information.

\* \* \* \* \*